US011250976B2

(12) United States Patent
Nakano et al.

(10) Patent No.: US 11,250,976 B2
(45) Date of Patent: Feb. 15, 2022

(54) RARE EARTH THIN FILM MAGNET, PROCESS FOR PRODUCING SAME, AND TARGET FOR FORMING RARE EARTH THIN FILM MAGNET

(71) Applicant: JX Nippon Mining & Metals Corporation, Tokyo (JP)

(72) Inventors: Masaki Nakano, Nagasaki (JP); Hirotoshi Fukunaga, Nagasaki (JP); Takeshi Yanai, Nagasaki (JP); Masaru Itakura, Nagasaki (JP); Hironobu Sawatari, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 501 days.

(21) Appl. No.: 15/112,458

(22) PCT Filed: Mar. 3, 2015

(86) PCT No.: PCT/JP2015/056139
§ 371 (c)(1),
(2) Date: Jul. 19, 2016

(87) PCT Pub. No.: WO2015/186389
PCT Pub. Date: Dec. 10, 2015

(65) Prior Publication Data
US 2016/0343482 A1 Nov. 24, 2016

(30) Foreign Application Priority Data
Jun. 4, 2014 (JP) .............................. JP2014-115719

(51) Int. Cl.
*H01F 1/00* (2006.01)
*C23C 14/16* (2006.01)
(Continued)

(52) U.S. Cl.
CPC ......... *H01F 1/0045* (2013.01); *C22C 33/003* (2013.01); *C22C 38/00* (2013.01);
(Continued)

(58) Field of Classification Search
CPC ...... H01F 1/0045; H01F 1/053; H01F 10/126; H01F 41/0253; H01F 41/205;
(Continued)

(56) References Cited

U.S. PATENT DOCUMENTS 5,676,998 A * 10/1997 Araki ...................... C23C 14/06
427/128
2012/0153212 A1* 6/2012 Liu ....................... B22F 1/0025
252/62.55
(Continued)

FOREIGN PATENT DOCUMENTS

| DE | 3915446 A1 * 11/1990 ............. H01F 1/057 |
| JP | 2009-091613 A 4/2009 |
| JP | 2012-207274 A 10/2012 |

OTHER PUBLICATIONS

Fukunaga, H., et al. "Effect of Laser Beam Parameters on Magnetic Properties of Nd-Fe-B Thick-Film Magnets Fabricated by Pulsed Laser Deposition." Journal of Applied Physics, vol. 109, No. 7, (2011) (Year: 2011).*
(Continued)

*Primary Examiner* — Paul A Wartalowicz
*Assistant Examiner* — Ryan L Heckman
(74) *Attorney, Agent, or Firm* — Howson & Howson LLP

(57) ABSTRACT

The present invention provides a rare earth thin film magnet having Nd, Fe, and B as essential components, wherein the rare earth thin film magnet has a texture in which an α-Fe phase and a $Nd_2Fe_{14}B$ phase are alternately arranged three-dimensionally, and each phase has an average crystal grain size of 10 to 30 nm. An object of this invention is to provide
(Continued)

a rare earth thin film magnet having superior mass productivity and reproducibility and favorable magnetic properties, as well as to provide the production method thereof and a target for producing the thin film.

5 Claims, 6 Drawing Sheets

(51) Int. Cl.
  C22C 38/00    (2006.01)
  H01F 10/12    (2006.01)
  H01F 41/20    (2006.01)
  C22C 33/00    (2006.01)
  C22C 45/02    (2006.01)
  C23C 14/28    (2006.01)
  C23C 14/58    (2006.01)
  H01F 1/053    (2006.01)
  H01F 41/02    (2006.01)

(52) U.S. Cl.
  CPC .......... C22C 38/002 (2013.01); C22C 38/005 (2013.01); C22C 45/02 (2013.01); C23C 14/16 (2013.01); C23C 14/28 (2013.01); C23C 14/5806 (2013.01); H01F 1/053 (2013.01); H01F 10/126 (2013.01); H01F 41/0253 (2013.01); H01F 41/205 (2013.01)

(58) Field of Classification Search
  CPC ... C22C 33/003; C22C 38/002; C22C 38/005; C22C 45/02; C23C 14/16; C23C 14/28; C23C 14/5806
  See application file for complete search history.

(56)         References Cited

U.S. PATENT DOCUMENTS

2014/0010955 A1*  1/2014  Yamashita ............ C22C 38/12
                                              427/127
2015/0017053 A1   1/2015  Shindo
2015/0262752 A1   9/2015  Sawatari
2015/0270038 A1*  9/2015  Endo ..................... H02K 1/02
                                              310/152
2017/0356081 A1  12/2017  Nakano et al.

OTHER PUBLICATIONS

Popov, A. G., et al. "Preparation of High-Power Permanent Magnets from Platelike Nd—Fe—B Alloys." The Physics of Metals and Metallography, vol. 109, No. 3, 2010, pp. 238-246 (Year: 2010).*
Machine Translation of DE-3915446-A1 (Year: 1990).*
H. Fukunaga et al., "Effect of Laser Beam Parameters on Magnetic Properties of Nd—Fe—B Thick-Film Magnets Fabricated by Pulsed Laser Deposition", Journal of Applied Physics, vol. 109, Issue 7, pp. 07A758-1—07A7583, Apr. 2011.
N.M. Dempsey et al., "High Performance Hard Magnetic NdFeB Thick Films for Integration into Micro-Electro-Mechanical-Systems", Applied Physics Letters, vol. 90, pp. 092509-1-092509-3, 2007 (month unknown).
H. Fukunaga et al., "Magnetic Properties of Nd—Fe—B/a—Fe Multi-Layered Thick-Film Magnets", Journal of Physics Conference Series, vol. 266, pp. 012027-1-012027-5, 2011 (month unknown).
G. Reiger et al., "Nd—Fe—B Permanent Magnets (Thick Films) Produced by a Vacuum-Plasma-Spraying Process", Journal of Applied Physics, vol. 87, pp. 5329-5331, 2000 (month unknown) (Abstract Only).
M. Nakano et al., "Review of Fabrication and Characterization of Nd—Fe—B Thick Films for Magnetic Micromachines", IEEE Transactions on Magnets, vol. 43, Issue 6, pp. 2672-2676, Jun. 2007 (Abstract Only).
M. Ishizone et al., "Magnetic Properties and Crystallite Orientation in Nd2Fe14B—a—Fe Nanocomposite Thin Films", The Magnetics Society of Japan Journal, vol. 24, No. 4-2, pp. 423-426, Jan. 2000.
S Sato, "Nano Kessho Kozo o Motsu Nanshitsu Oyobi Koshitsu Jisei Zairyo ni Okeru Hojiryoku Kiko no Kaiseki", University of Tsukuba Daigakuin Hakushi Katei Suri Busshitsu Kagaku Kenkyuka Hakushi Ronbun, University of Tsukuba Daigakuin, pp. 91 to 98, Feb. 2012 (English Summary provided).

* cited by examiner

[Fig. 1]
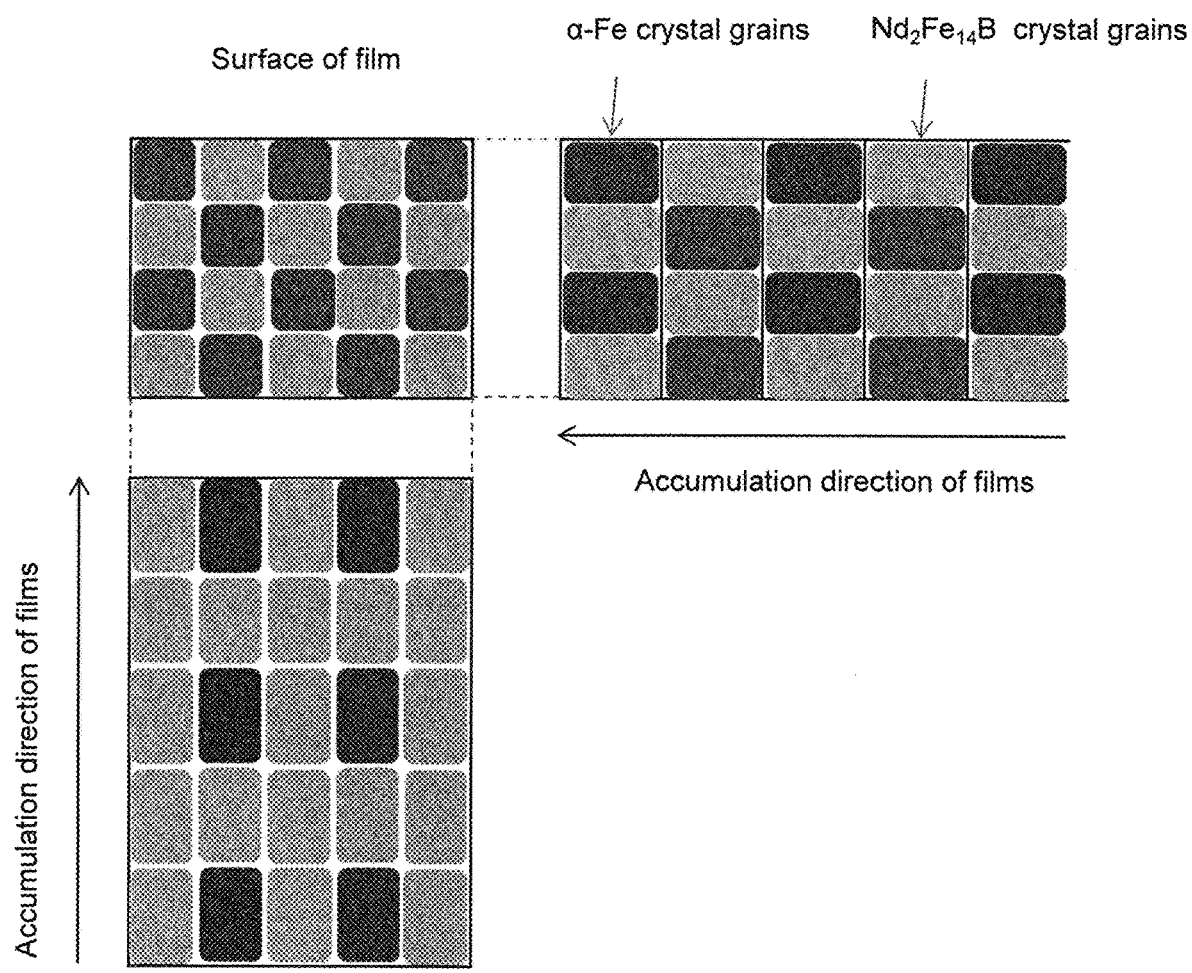

[Fig. 2]
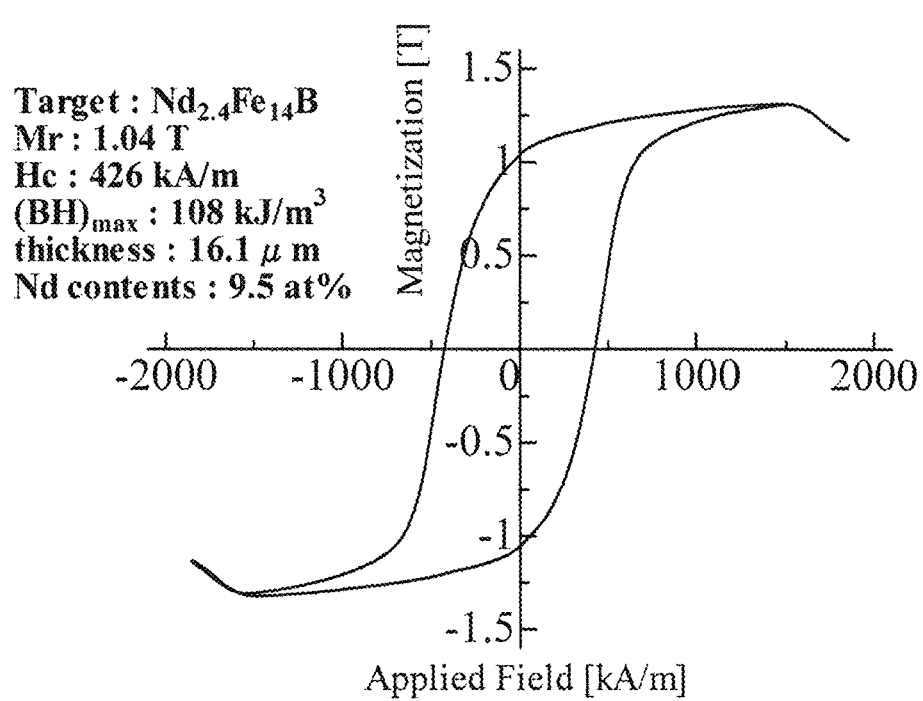

[Fig. 3]
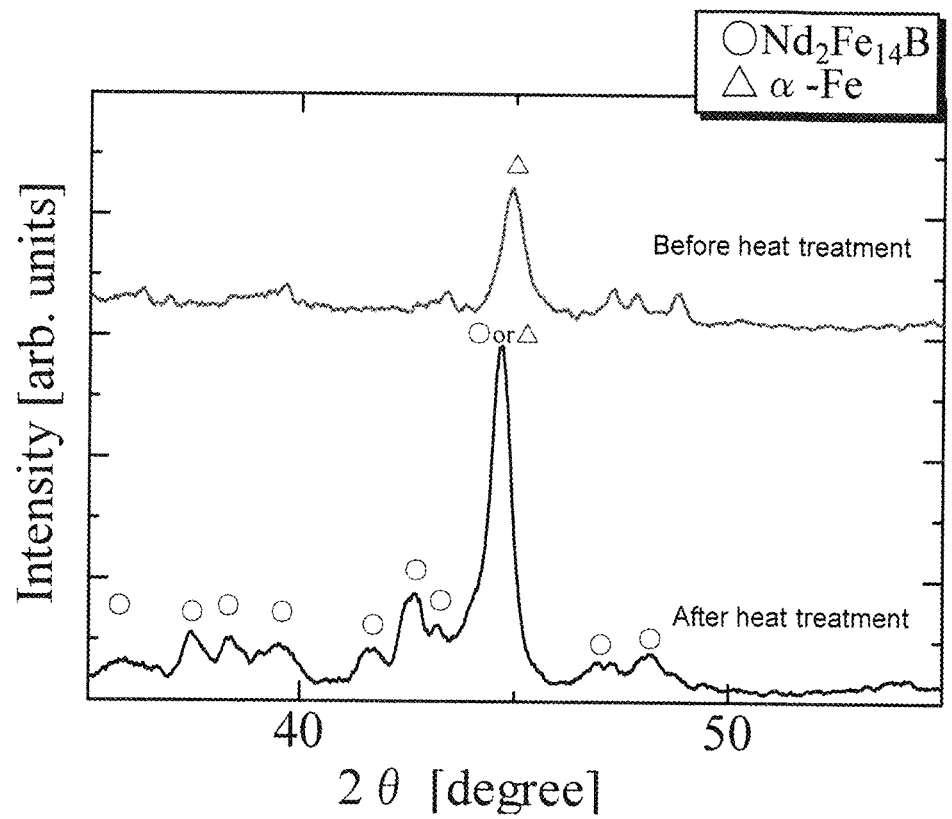
[Fig. 4]
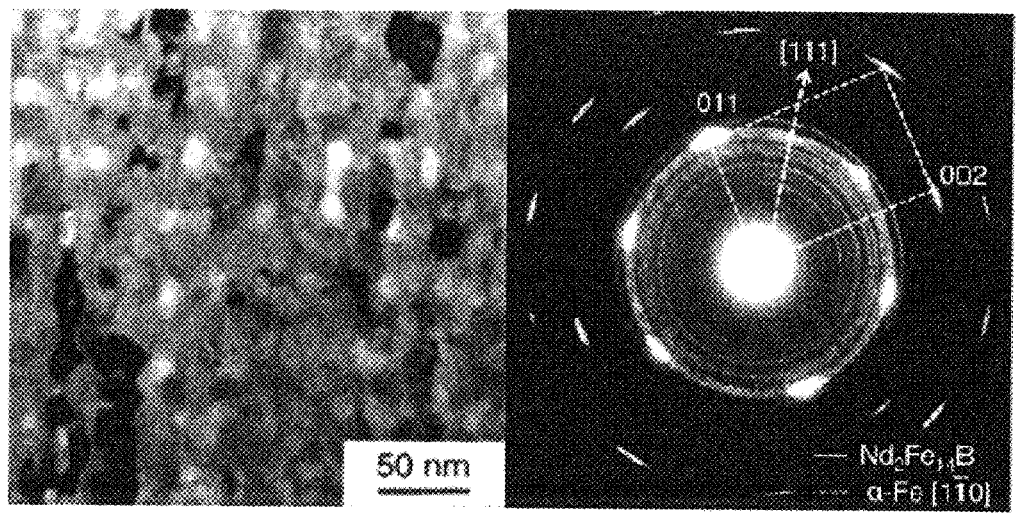

[Fig. 5]
Dark field image of α-Fe crystal grains
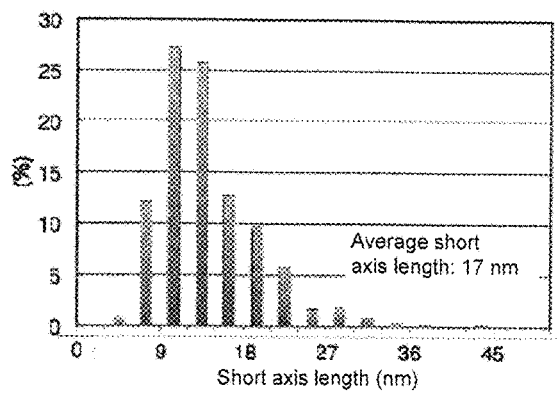
Distribution of short axis length of α-Fe crystal grains
Dark field image of $Nd_2Fe_{14}B$ crystal grains
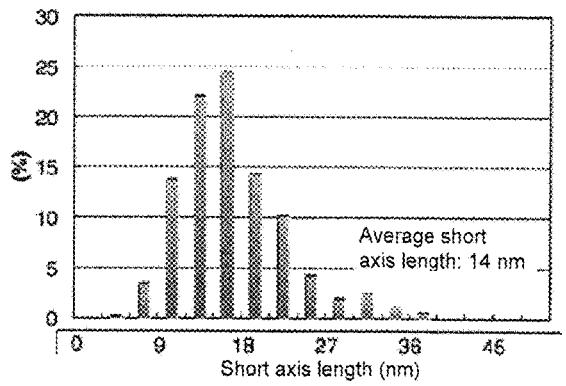
Distribution of short axis length of $Nd_2Fe_{14}B$ crystal grains

[Fig. 6]
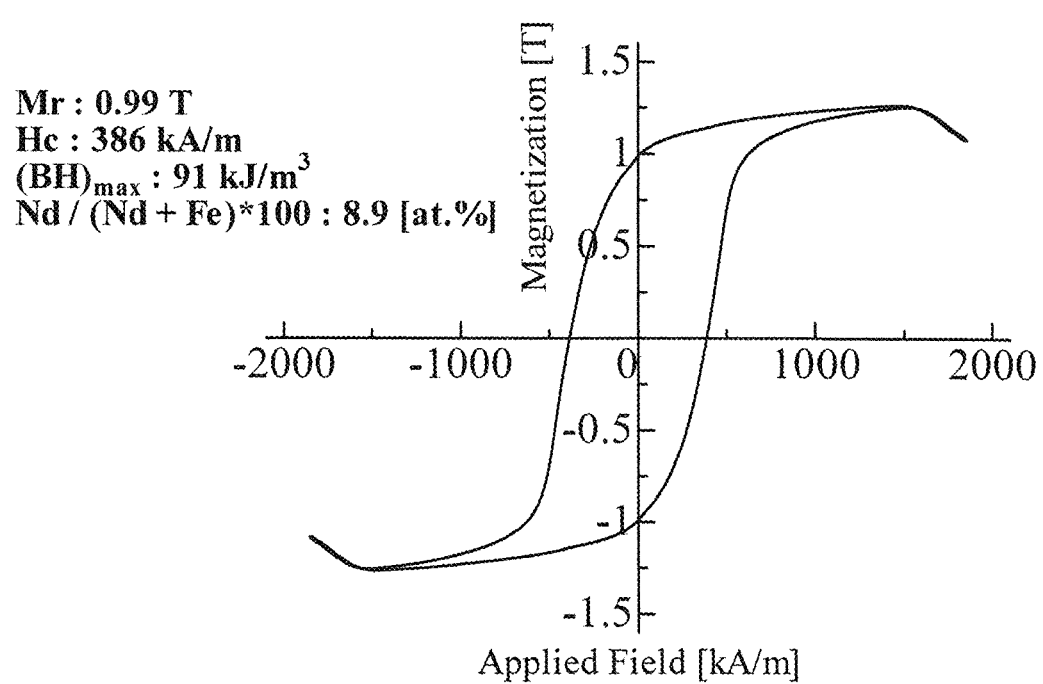

[Fig. 7]
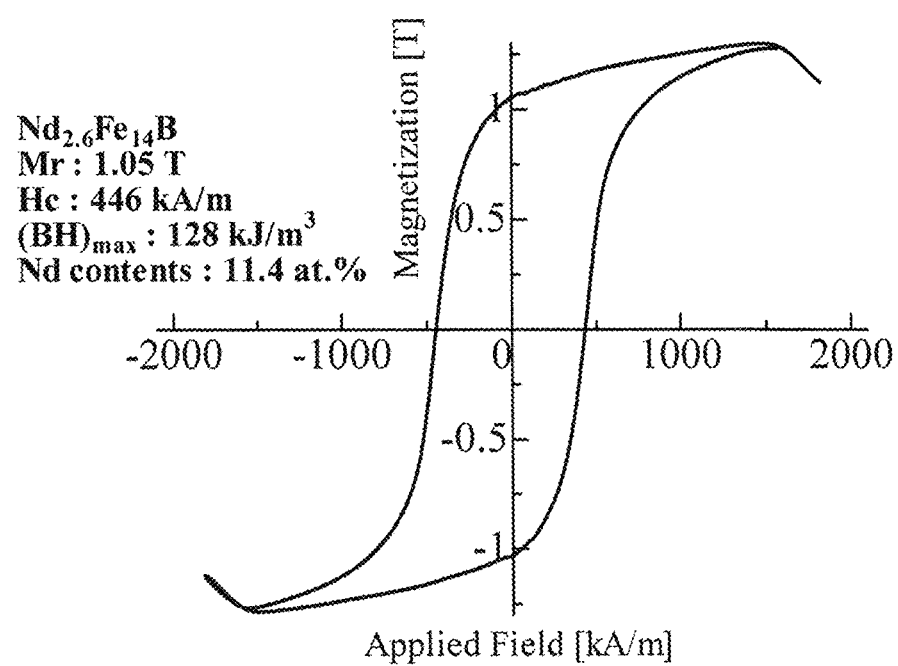

RARE EARTH THIN FILM MAGNET, PROCESS FOR PRODUCING SAME, AND TARGET FOR FORMING RARE EARTH THIN FILM MAGNET

BACKGROUND

The present invention relates to a rare earth thin film magnet formed via pulsed laser deposition (PLD), a method of producing such a rare earth thin film magnet, and a target used for producing such a rare earth thin film magnet.

In recent years, pursuant to the weight-saving and downsizing of electronic devices, the miniaturization and sophistication of rare earth magnets having superior magnetic properties are being advanced. Among the above, since a neodymium-iron-boron (Nd—Fe—B)-based magnet exhibits the highest maximum energy product among existing magnets, the practical application thereof to MEMS (Micro Electro Mechanical Systems), energy sectors such as energy harvest, and medical device sectors is expected.

This kind of rare earth magnet thin film is known to be produced via the sputtering method (Patent Document 1, Non-Patent Document 1) or via pulsed laser deposition (Patent Document 2, Non-Patent Document 2) or other PVD (Physical Vapor Deposition) methods (Non-Patent Document 3). For example, Patent Document 2 describes that it is possible to obtain, via the laser ablation method using a pulsed YAG laser, a Nd—Fe—B-based thin film mainly made from a $Nd_2Fe_{14}B$ phase and having favorable compositional transition between the target and the film, and in which the deposition rate is higher than the sputtering method by 1 digit or more.

It has been reported that a magnet of a rare earth thin film produced with the foregoing method takes on the following values; specifically, coercive force: approximately 1000 kA/m, remnant magnetization: 0.6 T, and maximum energy product $(BH)_{max}$: 60 kJ/m$^3$ (Non-Patent Document 4). Nevertheless, among the foregoing numerical values, it cannot be said that the remnant magnetization and the maximum energy product are magnetic properties that can be put into practical application, and, for instance, because they are insufficient for driving a compact motor, further improvement of magnetic properties is being strongly demanded.

As one method of improving the thin film characteristics, it is effective to combine an α-Fe soft magnetic phase and a $Nd_2Fe_{14}B$ hard magnetic phase to achieve a nano composite structure. A thin film magnet having this structure can function as though it is a hard magnetic phase (single phase) by causing a soft magnetic phase and a hard magnetic phase, both having a crystal grain size of several nm to several ten nm, to coexist in the texture of the thin film, and subjecting the magnetic properties of both phases to exchange coupling in order to prevent the magnetization reversal of the soft magnetic phase in a low magnetic field.

There are the following two types of nano composite films; specifically, a type referred to as a layered nano composite film in which an α-Fe soft magnetic phase and a $Nd_2Fe_{14}B$ hard magnetic phase are alternately layered two-dimensionally to achieve a multi-layered structure, and a type referred to as a dispersed nano composite film in which an α-Fe soft magnetic phase and a $Nd_2Fe_{14}B$ hard magnetic phase are randomly dispersed, three-dimensionally, in the film. With regard to the former, $Nd_2Fe_{14}B/\alpha$-Fe are periodically accumulated up to 800 layers via pulsed laser deposition to deposit a multilayered film having a thickness of approximately 10 μm, and it is disclosed that the maximum energy product reached 90 kJ/m$^3$ (Non-Patent Document 5).

Nevertheless, with the nano composite film produced with the foregoing method, since droplets that are unique to pulsed laser deposition are accumulated on the film surface and generate unevenness, as the number of layers increases, the steepness of the compositional change at the interface of the soft magnetic phase and the hard magnetic phase will gradually deteriorate and, consequently, there is concern in that the magnetic properties of the thin film will deteriorate.

With regard to the latter, Non-Patent Document 6 describes the deposition of a $Nd_2Fe_{14}B/\alpha$-Fe dispersed nano composite film based on the magnetron sputtering method, and that heat treatment is performed during the process (Non-Patent Document 6). Nevertheless, the dispersed nano composite film produced based on the foregoing method is not yet able to obtain sufficient magnetic properties.

Prior Art Documents

Patent Documents

[Patent Document 1] Japanese Patent Application Publication No. 2012-207274

[Patent Document 2] Japanese Patent Application Publication No. 2009-091613

Non-Patent Documents

[Non-Patent Document 1] N. M. Dempsey, A. Walther, F. May, D. Givord, K. Khlopkov, O. Gutfeisch: Appl. Phys. Lett. 90 (2007) 092509-1-092509-3.

[Non-Patent Document 2] H. Fukunaga, T. Kamikawatoko, M. Nakano, T. Yanai, F. Yamashita: J. Appl. Phys. 109 (2011) 07A758-1-07A758-3.

[Non-Patent Document 3] G. Rieger, J. Wecker, W. Rodewalt, W. Scatter, Fe.-W. Bach, T. Duda and W. Unterberg: J. Appl. Phys. 87 (2000) 5329-5331.

[Non-Patent Document 4] M. Nakano, S. Sato, F. Yamashita, T. Honda, J. Yamasaki, K. Ishiyama, M. Itakura, J. Fidler, T. Yanai, H. Fukunaga: IEEE Trans. Magn. 43 (2007) 2672-2676.

[Non-Patent Document 5] H. Fukunaga, H. Nakayama, T. Kamikawamoto, T. Yanai, M. Nakano, F. Yamashita, S. Ohta, M. Itakura, M. Nishida: J. Phys. Conf. Ser. 266 (2011) 012027-1-012027-5.

[Non-Patent Document 6] Ishizone, Nomura, Kato, Miyazaki, Honkawa: The Magnetics Society of Japan Journal 24 (2000) 423-426.

SUMMARY

An object of the present invention is to prepare a rare earth thin film magnet having a nano composite structure in which an α-Fe phase and a $Nd_2Fe_{14}B$ phase are alternately arranged three-dimensionally, and having superior mass productivity and reproducibility and favorable magnetic properties, as well as to provide a method of producing such a rare earth thin film magnet and a target for producing such as rare earth thin film magnet.

In order to achieve the foregoing object, as a result of intense study, the present inventors discovered that a rare earth thin film having a nano composite structure in which an α-Fe phase and a $Nd_2Fe_{14}B$ phase are alternately arranged three-dimensionally can be deposited from a single target made from a single phase by optimizing the composition of the target and the pulsed laser power density used in the deposition performed via pulsed laser deposition. The nano composite structure in the present invention refers to a structure in which an α-Fe phase, which is a soft magnetic phase having high magnetization, and a $Nd_2Fe_{14}B$ phase, which is a hard magnetic phase that exhibits coercive force, are alternately arranged three-dimensionally, and having an average crystal grain size in the order of several ten nm. The schematic diagram of this structure is shown in FIG. 1.

Based on the foregoing discovery, the present invention provides the following means.

1) A rare earth thin film magnet having Nd, Fe, and B as essential components, wherein the rare earth thin film magnet has a texture in which an α-Fe phase and a $Nd_2Fe_{14}B$ phase are alternately arranged three-dimensionally, and each phase has an average crystal grain size of 10 to 30 nm.

2) The rare earth thin film magnet according to 1) above, wherein a film thickness is 5 μm or more, and a maximum energy product $(BH)_{max}$ is 90 $kJ/m^3$ or more and 130 $kJ/m^3$ or less.

3) A target for forming a rare earth thin film magnet, wherein the target is made from $Nd_xFe_{14}B$ (where X is a number that satisfies 1.8 to 2.7).

4) The target for forming a rare earth thin film magnet according to 3) above, wherein the target is used for forming, via pulsed laser deposition, a rare earth thin film magnet having Nd, Fe, and B as essential components, having a texture in which an α-Fe phase and a $Nd_2Fe_{14}B$ phase are alternately arranged three-dimensionally, and each phase having an average crystal grain size of 10 to 30 nm.

5) A method of producing a rare earth thin film magnet, including a process of depositing a rare earth thin film via pulsed laser deposition by using the target according to 3) or 4) above, a process of crystallizing the deposited rare earth thin film by performing heat treatment thereto, and a process of magnetizing the crystallized rare earth thin film to prepare a rare earth thin film magnet.

6) The method of producing a rare earth thin film magnet according to 5) above, wherein a pulsed laser power density is set to 1 to 1000 $J/cm^2$ in the process of depositing the rare earth thin film.

7) The method of producing a rare earth thin film magnet according to 5) or 6) above, wherein the heat treatment is performed under conditions of output: 7 to 9 kW and time: 1 to 5 seconds in the process of crystallizing the rare earth thin film.

The present invention can prepare, via pulsed laser deposition, a rare earth thin film magnet having a nano composite structure in which an α-Fe phase and a $Nd_2Fe_{14}B$ phase are alternately arranged three-dimensionally. The thus obtained rare earth thin film magnet yields a superior effect of exhibiting favorable magnetic properties. Moreover, the present invention can stably deposit the rare earth thin film magnet having a nano composite structure from a single target made from a single phase, and thus yield a superior effect of being able to improve the productivity from the perspective of production costs.

BRIEF DESCRIPTION OF THE DRAWINGS

FIG. 1 is a schematic diagram showing the texture of the rare earth thin film magnet of the present invention.

FIG. 2 is an M-H characteristic diagram of the rare earth thin film magnet of Example 1.

FIG. 3 is an X-ray diffraction diagram of the rare earth thin film magnet of Example 1 before and after the heat treatment.

FIG. 4 is a SAD (Selected Area Diffraction) diagram corresponding to the TEM bright field image of the texture after the heat treatment Example 1.

FIG. 5 is a distribution diagram of the α-Fe crystal grains and the $Nd_2Fe_{14}B$ crystal grains in the rare earth thin film magnet of Example 1.

FIG. 6 is an M-H characteristic diagram of the rare earth thin film magnet of Example 2.

FIG. 7 is an M-H characteristic diagram of the rare earth thin film magnet of Example 3.

DETAILED DESCRIPTION OF EMBODIMENT

The rare earth thin film magnet of the present invention contains Nd (neodymium), Fe (iron) and B (boron) as essential components, has a nano composite structure, which is a texture in which an α-Fe phase (black part in FIG. 1) and a $Nd_2Fe_{14}B$ phase (gray part in FIG. 1) are alternately arranged three-dimensionally as shown in FIG. 1, and the average crystal grain size of the α-Fe phase and the $Nd_2Fe_{14}B$ phase is 10 to 30 nm.

The α-Fe phase approaches superparamagnetism when assuming that the isolated grains become less than 10 nm. Meanwhile, when the average crystal grain size exceeds 30 nm, since the exchange coupling with the $Nd_2Fe_{14}B$ phase will deteriorate, the grain boundary of the α-Fe crystal grains of the soft magnetic phase which functions as the pinning effect of magnetization reversal will decrease, and the abundance ratio of the grain boundary of the α-Fe crystal grains and the $Nd_2Fe_{14}B$ crystal grains will decrease, the coercive force will deteriorate. Accordingly, the average crystal grain size of the α-Fe phase is set to be within the foregoing numerical range.

Moreover, since the single-domain crystal grain size of the $Nd_2Fe_{14}B$ phase is roughly 240 nm, the precondition is that the average crystal grain size is not greater than the single-domain crystal grain size and, as described above, because the average crystal grain size of the adjacent α-Fe phase is 10 to 30 nm, if the average crystal grain size is any larger, unevenness with the α-Fe phase will arise and the exchange coupling will deteriorate. Accordingly, the average crystal grain size of the $Nd_2Fe_{14}B$ phase is set to be within the foregoing numerical range.

The average crystal grain size of the respective phases is obtained as follows. An α-Fe phase and a $Nd_2Fe_{14}B$ amorphous phase are prepared via pulsed laser deposition, the $Nd_2Fe_{14}B$ amorphous phase is thereafter crystallized via heat treatment, the obtained crystallized texture is observed using a Transmission Electron Microscope (TEM), dark field images are obtained with crystals contained in the crystallized texture, the crystals having a stripe shape, diameters of the stripes are measured as short axis diameters of the stripe shape crystals to obtain a distribution of the short axis diameters, and an average crystal grain size is calculated from the distribution of the short axis diameters as an arithmetic mean for each of the α-Fe phase and the $Nd_2Fe_{14}B$ phase.

The rare earth thin film magnet of the present invention is characterized in having a film thickness of 5 μm or more, and a maximum energy product $(BH)_{max}$ of 90 $kJ/m^3$ or more. The reason why the film thickness is caused to be 5 μm or more is because (1) since a magnetic field needs to be generated in certain areas when applied to compact electronic devices, (2) if the dimensional ratio of the length of the in-plane direction and the length (film thickness) in a direction that is perpendicular to the plane increases, it becomes difficult to extract a sufficient magnetic field externally in the perpendicular direction from the film surface due to the influence of the demagnetizing field. It is known that the ideal dimensional ratio (aspect ratio) is roughly 1:1. The present invention can realize a maximum energy product $(BH)_{max}$ of 90 kJ/m$^3$ or more in this kind of thin film magnet by comprising a fine nano composite structure.

The target for forming a rare earth thin film magnet of the present invention is characterized in being made from Nd$_x$Fe$_{14}$B (where X is a number that satisfies 1.8 to 2.7). When X is less than 1.8, while the remnant magnetization value will exhibit a high value constantly exceeding 1.0 T, the volume ratio of the Nd$_2$Fe$_{14}$B phase will decrease, and, therefore, the exchange coupling of the α-Fe phase will decrease, and the coercive force will decrease to be less than 200 kA/m. Meanwhile, when X exceeds 2.7, the volume ratio of the Fe phase will decrease and Nd as the excessive nonmagnetic component will remain, and there are problems in that the remnant magnetization will deteriorate, or the exchange coupling performance will deteriorate. Accordingly, X is set to be within the foregoing numerical range.

The rare earth thin film magnet of the present invention can be produced, for example, as follows.

A target having a composition of Nd$_{2.4}$Fe$_{14}$B is mounted on a pulsed laser deposition device. Next, the inside of the chamber is evacuated until the vacuum degree becomes 10$^{-5}$ Pa, and the target is thereafter irradiated with a laser through a condenser lens. As the laser, a Nd:YAG laser (emission wavelength: 355 nm, repetition frequency: 30 Hz) may be used. The power density of the laser is set to be 1 to 1000 J/cm$^2$. When the laser power density is less than 1 J/cm$^2$, a large amount of droplets will arise when the target is irradiated with the laser and cause the density to deteriorate, and then cause the magnetic properties to deteriorate. Meanwhile, when the laser power density exceeds 1000 J/cm$^2$, etching of the target caused by the laser irradiation will occur considerably, and undesirable phenomena, such as the discontinuation of the ablation phenomena, will arise.

On the target surface that was irradiated with a laser as described above, a chemical reaction and a melting reaction will occur, and a plasma referred to as a plume is generated. As a result of the plume reaching the opposing substrate, it is possible to form a thin film made from a nano composite structure in which the α-Fe phase and the Nd—Fe—B-based amorphous phase are dispersed three-dimensionally, and arranged alternately. As the substrate, Ta, Ti, W, Mo, Zr, and Nb having a high melting point may be used. Among the above, Ta and Ti having a high getter effect of oxygen is effective, and the foregoing elements may be used as a buffer layer in a Si substrate or a quartz glass substrate. Furthermore, a metal substrate made from Fe, Co, Ni and their alloys having high magnetic permeability may also be used in consideration of application to millimeter-sized motors.

With the thin film deposited as described above, α-Fe fine crystal grains are distributed and arranged three-dimensionally in the Nd—Fe—B-based amorphous mother phase. Thus, after the deposition, it is necessary to perform heat treatment under the conditions of output: 7 to 9 kW, time: 1 to 5 seconds, and crystallize the Nd—Fe—B-based amorphous mother phase. Here, when the heat treatment is performed under the conditions of output: less than 7 kW, time: less than 1 second, it will be difficult to crystallize the Nd—Fe—B-based amorphous phase in the film, or numerous amorphous phases will remain. Meanwhile, when the heat treatment is performed under the conditions of output: exceeding 9 kW, time: exceeding 5 seconds, (1) the Nd$_2$Fe$_{14}$B crystal grains in the film become coarse, and the α-Fe crystal grains also become coarse, or (2) since a heterogenous phase other than the Nd$_2$Fe$_{14}$B phase and the α-Fe phase will emerge, the magnetic properties will deteriorate. Thus, the heat treatment conditions are set to be within the range of output: 7 to 9 kW, time: 1 to 5 seconds. Subsequently, by performing, for instance, pulsed magnetization to this thin film at a magnetic field of 7 T, it is possible to prepare a rare earth thin film magnet. Note that there is no particular limitation in the magnetization method in the present invention, and a publicly known magnetization method may be used. It is thereby possible to produce the rare earth thin film magnet of the present invention having a nano composite structure of an α-Fe phase and a Nd$_2$Fe$_{14}$B phase.

EXAMPLES

The present invention is now explained based on the following Examples and Comparative Examples. Note that these Examples merely illustrate certain examples of the present invention, and this invention is not limited in any way by these Examples. In other words, the present invention is limited only by the scope of its claims, and covers the various modifications other than the Examples that are included in this invention.

Example 1

A Nd$_{2.4}$Fe$_{14}$B target having a purity of 99.9% (3N) and a relative density of 99% was mounted on a pulsed laser deposition device, and the inside of a chamber was evacuated to a vacuum. Next, after confirming that a vacuum degree of 10$^{-5}$ Pa has been attained, the target being rotated at approximately 6.5 rpm was irradiated with a Nd:YAG laser (emission wavelength: 355 nm) at a repetition frequency of 30 Hz to subject the target material to ablation, and a composite film made from a stripe shape α-Fe crystal phase and a Nd—Fe—B-based amorphous mother phase and having a thickness of 10 μm or more was deposited on a Ta substrate. Here, the laser power density on the target surface was set to be roughly 10 J/cm$^2$ by the setting the distance between the target and the substrate to 10 mm and setting the laser intensity to 4 W, and condensing the laser beam on the target surface through a condenser lens. Next, pulsed annealing treatment (heat treatment temperature: roughly 500 to 800° C.) was performed at an output of 8 kW and for approximately 2 seconds to crystallize the Nd—Fe—B-based amorphous phase. Subsequently, pulsed magnetization was performed at a magnetic field of 7 T to prepare a rare earth thin film magnet. Note that the film thickness was evaluated using a micro meter, compositional analysis was performed using EDX (Energy Dispersive X-ray spectroscopy).

The magnetic properties of the thus obtained rare earth thin film magnet were evaluated using a VSM (Vibrating Sample Magnetometer). FIG. 2 shows the M-H characteristics of the rare earth thin film magnet of Example 1. As shown in FIG. 1, remnant magnetization was 1.04 T, coercive force was 26 kA/m, $(BH)_{max}$ was 108 kJ/m$^3$ and favorable results were obtained. Next, the X-ray diffraction diagram of the rare earth thin film before and after the heat treatment is shown in FIG. 3. As shown in FIG. 3, while the α-Fe phase after the deposition is crystallized, the Nd$_2$Fe$_{14}$B phase is an amorphous phase. Moreover, it was confirmed that the Nd$_2$Fe$_{14}$B phase had crystallized as a result of undergoing heat treatment. Next, the texture of the rare earth thin film after undergoing heat treatment was observed using TEM. The results are shown in FIG. 4. In the right figure of FIG. 4, the part showing the white contrast and the black contrast is the α-Fe crystal grains, and the mother phase part showing the gray contrast is the Nd$_2$Fe$_{12}$B crystal grains.

From this TEM image, it was confirmed that the rare earth thin film has a nano composite structure in which the α-Fe crystal grains and the $Nd_2Fe_{12}B$ crystal grains are alternately arranged three-dimensionally in an island shape. FIG. 5 shows the distribution of the α-Fe crystal grains and the $Nd_2Fe_{12}B$ crystal grains. The former shows the measurement result where the N quantity is 1044, and the latter shows the measurement result where the N quantity is 339. Based on this diagram, the average crystal grain size of the α-Fe phase was approximately 17 nm, and the average crystal grain size of the $Nd_2Fe_{12}B$ phase was approximately 14 nm.

Example 2

A $Nd_{1.8}Fe_{14}B$ target having a purity of 99.9% (3N) and a relative density of 99% was mounted on a pulsed laser deposition device, and the inside of a chamber was evacuated to a vacuum. Next, after confirming that a vacuum degree of $10^{-5}$ Pa has been attained, the target being rotated at approximately 6.5 rpm was irradiated with a Nd:YAG laser (emission wavelength: 355 nm) at a repetition frequency of 30 Hz to subject the target material to ablation, and a Nd—Fe—B-based amorphous film having a thickness of 10 μm or more was deposited on a Ta substrate. Here, the laser power density on the target surface was set to be 10 $J/cm^2$ by the setting the distance between the target and the substrate to 10 mm and setting the laser intensity to 4 W, and condensing the laser beam on the target surface through a condenser lens. Next, pulsed annealing treatment (heat treatment temperature: roughly 500 to 800° C.) was performed at an output of 8 kW and for approximately 2 seconds to crystallize the Nd—Fe—B-based amorphous phase. Subsequently, pulsed magnetization was performed at a magnetic field of 7 T to prepare a rare earth thin film magnet. Note that the film thickness was evaluated using a micro meter, compositional analysis was performed using EDX.

The magnetic properties of the thus obtained rare earth thin film magnet were evaluated using a VSM. FIG. 6 shows the M-H characteristics of the rare earth thin film magnet of Example 2. As shown in FIG. 6, remnant magnetization was roughly 0.99 T, coercive force was 386 kA/m, $(BH)_{max}$ was 91 $kJ/m^3$ and favorable results were obtained. Next, the texture of the rare earth thin film after undergoing heat treatment was observed using TEM. As a result of measuring the crystal grains using the same method as Example 1, the average crystal grain size of the α-Fe phase was approximately 16 nm, and the average crystal grain size of the $Nd_2Fe_{14}B$ phase was approximately 14 nm.

Example 3

A $Nd_{2.6}Fe_{14}B$ target having a purity of 99.9% (3N) and a relative density of 99% was mounted on a pulsed laser deposition device, and the inside of a chamber was evacuated to a vacuum. Next, after confirming that a vacuum degree of $10^{-5}$ Pa has been attained, the target being rotated at approximately 6.5 rpm was irradiated with a Nd:YAG laser (emission wavelength: 355 nm) at a repetition frequency of 30 Hz to subject the target material to ablation, and a Nd—Fe—B-based amorphous film having a thickness of 10 μm or more was deposited on a Ta substrate. Here, the laser power density on the target surface was set to be 10 $J/cm^2$ by the setting the distance between the target and the substrate to 10 mm and setting the laser intensity to 4 W, and condensing the laser beam on the target surface through a condenser lens. Next, pulsed annealing treatment (heat treatment temperature: roughly 500 to 800° C.) was performed at an output of 8 kW and for approximately 2 seconds to crystallize the Nd—Fe—B-based amorphous phase. Subsequently, pulsed magnetization was performed at a magnetic field of 7 T to prepare a rare earth thin film magnet. Note that the film thickness was evaluated using a micro meter, compositional analysis was performed using EDX.

The magnetic properties of the thus obtained rare earth thin film magnet were evaluated using a VSM. FIG. 7 shows the M-H characteristics of the rare earth thin film magnet of Example 3. As shown in FIG. 7, remnant magnetization was roughly 1.05 T, coercive force was 446 kA/m, $(BH)_{max}$ was 128 $kJ/m^3$ and favorable results were obtained. Next, the texture of the rare earth thin film after undergoing heat treatment was observed using TEM. As a result of measuring the crystal grains using the same method as Example 1, the average crystal grain size of the α-Fe phase was approximately 18 nm, and the average crystal grain size of the $Nd_2Fe_{14}B$ phase was approximately 15 nm.

Comparative Example 1

A $Nd_{1.4}Fe_{14}B$ target having a purity of 99.9% (3N) and a relative density of 99% was mounted on a pulsed laser deposition device, and the inside of a chamber was evacuated to a vacuum. Next, after confirming that a vacuum degree of $10^{-5}$ Pa has been attained, the target being rotated at approximately 6.5 rpm was irradiated with a Nd:YAG laser (emission wavelength: 355 nm) at a repetition frequency of 30 Hz to subject the target material to ablation, and a Nd—Fe—B-based amorphous film having a thickness of 10 μm or more was deposited on a Ta substrate. Here, the laser power density on the target surface was set to be 1 $J/cm^2$ by the setting the distance between the target and the substrate to 10 mm and setting the laser intensity to 4 W, and condensing the laser beam on the target surface through a condenser lens. Next, pulsed annealing treatment (heat treatment temperature: roughly 500 to 800° C.) was performed at an output of 8 kW and for approximately 2 seconds to crystallize the Nd—Fe—B-based amorphous phase. Subsequently, pulsed magnetization was performed at a magnetic field of 7 T to prepare a rare earth thin film magnet. Note that the film thickness was evaluated using a micro meter, compositional analysis was performed using EDX.

The magnetic properties of the thus obtained rare earth thin film magnet were evaluated using a VSM. Consequently, remnant magnetization was roughly 0.8 T, coercive force was 300 kA/m, $(BH)_{max}$ was, at maximum, 60 $kJ/m^3$, and the results were inferior in comparison to the Examples. Next, the texture of the rare earth thin film after undergoing heat treatment was observed using TEM. Consequently, it was confirmed that the α-Fe phase and the $Nd_2Fe_{14}B$ phase exist in a state of being dispersed in a range exceeding several 10 nm to 100 nm. In addition, in comparison to Example 1, the number of droplets discharged from the target was considerably great, and deterioration in the surface smoothness and density was confirmed.

Comparative Example 2

A single target obtained by combining $Nd_{2.6}Fe_{14}B$ and α-Fe having a purity of 99.9% (3N) and a relative density of 99% was mounted on a pulsed laser deposition device, and the inside of a chamber was evacuated to a vacuum. Next, after confirming that a vacuum degree of $10^{-5}$ Pa has been attained, the target being rotated at approximately 6.5 rpm was irradiated with a Nd:YAG laser (emission wavelength:

355 nm) at a repetition frequency of 30 Hz to subject the target material to ablation, and a composite film made from an α-Fe phase and a Nd—Fe—B-based amorphous phase having a thickness of 10 µm or more was deposited on a Ta substrate. Here, the laser power density on the target surface was set to be roughly 1 J/cm² by the setting the distance between the target and the substrate to 10 mm and setting the laser intensity to 4 W, and condensing the laser beam on the target surface through a condenser lens. Next, pulsed annealing treatment (heat treatment temperature: roughly 500 to 800° C.) was performed at an output of 8 kW and for approximately 2 seconds to crystallize the Nd—Fe—B-based amorphous phase. Subsequently, pulsed magnetization was performed at a magnetic field of 7 T to prepare a rare earth thin film magnet. Note that the film thickness was evaluated using a micro meter, compositional analysis was performed using EDX.

The magnetic properties of the thus obtained rare earth thin film magnet were evaluated using a VSM. Consequently, remnant magnetization was 0.9 T, coercive force was 400 kA/m, $(BH)_{max}$ was 100 kJ/m³, and, while these values are the same level when compared with Example 1, it was confirmed that the squareness thereof was considerably inferior in comparison to Example 1. In addition, in comparison to the Examples, the number of droplets discharged from the target was considerably great, and deterioration in the surface smoothness and density was confirmed.

Since the rare earth thin film magnet of the present invention which is prepared via pulsed laser deposition and has a nano composite structure in which an α-Fe phase and a $Nd_2Fe_{14}B$ phase are alternately arranged three-dimensionally yields favorable magnetic properties, the rare earth thin film magnet of the present invention is useful in a magnetic device that is applied to MEMS (Micro Electro Mechanical Systems), energy sectors such as energy harvest, and medical device sectors.

The invention claimed is:

1. A rare earth thin film magnet having Nd, Fe, and B as essential components, wherein the rare earth thin film magnet has a texture consisting of an α-Fe phase and a $Nd_2Fe_{14}B$ phase which are alternately arranged three-dimensionally in the texture, wherein each of the α-Fe phase and the $Nd_2Fe_{14}B$ phase has an average crystal grain size of 10 to 30 nm, and wherein the rare earth thin film magnet has a thickness of 5 µm or more, a maximum energy product $(BH)_{max}$ of 90 kJ/m³ or more and 130 kJ/m³ or less, a residual magnetization of 0.99 T or more and 1.05 T or less, and a coercivity of 386 kA/m or more and 446 kA/m or less.

2. A method of producing the rare earth thin film magnet according to claim 1, comprising the steps of depositing a rare earth thin film via pulsed laser deposition using a target made from $Nd_xFe_{14}B$, where X is a number that satisfies 1.8 to 2.7, crystallizing the deposited rare earth thin film by performing heat treatment thereto, and magnetizing the crystallized rare earth thin film to prepare the rare earth thin film magnet.

3. The method of producing a rare earth thin film magnet according to claim 2, wherein a pulsed laser power density is set to 1 to 1000 J/cm² in the step of depositing the rare earth thin film.

4. The method of producing a rare earth thin film magnet according to claim 3, wherein the heat treatment is performed under conditions of output: 7 to 9 kW and time: 1 to 5 seconds in the step of crystallizing the rare earth thin film.

5. The method of producing a rare earth thin film magnet according to claim 2, wherein the heat treatment is performed under conditions of output: 7 to 9 kW and time: 1 to 5 seconds in the step of crystallizing the rare earth thin film.

* * * * *